(12) United States Patent
Ahn

(10) Patent No.: US 9,793,051 B2
(45) Date of Patent: Oct. 17, 2017

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventor: Jin Mo Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/276,228

(22) Filed: Sep. 26, 2016

(65) Prior Publication Data

US 2017/0213647 A1    Jul. 27, 2017

(30) Foreign Application Priority Data

Jan. 21, 2016  (KR) .................. 10-2016-0007516

(51) Int. Cl.
| | | |
|---|---|---|
| *H01G 4/228* | (2006.01) | |
| *H01G 4/005* | (2006.01) | |
| *H01G 4/232* | (2006.01) | |
| *H01G 4/30* | (2006.01) | |
| *H01G 4/12* | (2006.01) | |

(Continued)

(52) U.S. Cl.
CPC ............ *H01G 4/232* (2013.01); *H01G 4/012* (2013.01); *H01G 4/1209* (2013.01); *H01G 4/248* (2013.01); *H01G 4/30* (2013.01); *H05K 1/111* (2013.01); *H05K 1/181* (2013.01);

(Continued)

(58) Field of Classification Search
CPC ........ H01G 4/12; H01G 4/1209; H01G 4/232; H01G 4/248
See application file for complete search history.

(56) References Cited

U.S. PATENT DOCUMENTS

| | | | | |
|---|---|---|---|---|
| 6,069,786 | A | * 5/2000 | Horie ............... | H01G 4/255 29/25.42 |
| 2006/0215350 | A1 | * 9/2006 | Tonogai ............ | H01G 4/30 361/311 |

(Continued)

FOREIGN PATENT DOCUMENTS

| | | |
|---|---|---|
| JP | 2006-324576 A | 11/2006 |
| JP | 2007-042743 A | 2/2007 |

(Continued)

OTHER PUBLICATIONS

Notice of Office Action Korean Patent Application No. 10-2016-0007516 dated Feb. 15, 2017 with full English translation.

*Primary Examiner* — Hoa C Nguyen
(74) *Attorney, Agent, or Firm* — McDermott Will & Emery LLP

(57) ABSTRACT

A multilayer ceramic capacitor includes a body including an active region including first and second internal electrodes, and an upper cover region disposed on the active region, and a lower cover region disposed below the active region. First and second external electrodes are disposed on first and second surfaces of the body in the length direction and connected to the first and second internal electrodes, respectively. At least one stress dispersion pattern occupying an area equal to 30% to 95% of an area of the first or second internal electrode is disposed in the cover region.

7 Claims, 6 Drawing Sheets

(51) Int. Cl.
  *H01G 4/248* (2006.01)
  *H05K 3/34* (2006.01)
  *H01G 4/012* (2006.01)
  *H05K 1/18* (2006.01)
  *H05K 1/11* (2006.01)
(52) U.S. Cl.
  CPC ... *H05K 3/341* (2013.01); *H05K 2201/10015* (2013.01); *H05K 2201/10636* (2013.01)

(56) References Cited

U.S. PATENT DOCUMENTS

| | | | |
|---|---|---|---|
| 2007/0025054 A1* | 2/2007 | Tonogai | H01G 4/30 361/303 |
| 2010/0271752 A1* | 10/2010 | Ishida | H01G 4/012 361/303 |
| 2012/0186682 A1* | 7/2012 | Golling | B64C 21/025 137/803 |
| 2012/0188684 A1* | 7/2012 | Akazawa | H01G 4/012 361/321.2 |
| 2014/0240897 A1 | 8/2014 | Chung et al. | |
| 2014/0311783 A1* | 10/2014 | Lee | H01G 4/005 174/260 |
| 2015/0016014 A1 | 1/2015 | Park et al. | |

FOREIGN PATENT DOCUMENTS

| | | |
|---|---|---|
| JP | 2014-165492 A | 9/2014 |
| KR | 10-2015-0007581 A | 1/2015 |
| KR | 10-2015-0019643 A | 2/2015 |

\* cited by examiner

US 9,793,051 B2

MULTILAYER CERAMIC CAPACITOR AND BOARD HAVING THE SAME

CROSS-REFERENCE TO RELATED APPLICATION(S)

This application claims the benefit of priority to Korean Patent Application No. 10-2016-0007516, filed on Jan. 21, 2016 in the Korean Intellectual Property Office, the entirety of which is incorporated herein by reference.

TECHNICAL FIELD

The present disclosure relates to a multilayer ceramic capacitor and a board having the same.

BACKGROUND

A multilayer ceramic capacitor (MLCC) has features including a small size, a high capacitance, and ease of mountability.

Such a multilayer ceramic capacitor may be mounted on the circuit boards of various electronic products, such as display devices including liquid crystal displays (LCDs), plasma display panels (PDPs), and the like, computers, smartphones, mobile phones, and the like, to thereby serve to charge and discharge electricity.

In addition, such a multilayer ceramic capacitor may be used together with a surface mount device (SMD)-type charge storage element mounted on a circuit board and an inductor or a resistor to thereby play a role as a filter or the like.

Recently, as electronic products such as mobile devices have been multifunctionalized and thinned, demand has increased for an ultra-small sized, thin, and high-capacitance multilayer ceramic capacitor (MLCC).

Therefore, as a thickness of a dielectric layer is decreased to submicron dimensions, a density of metal materials such as nickel (Ni), palladium (Pd), and the like, used as materials of internal electrodes is relatively increased, and a volume of a dielectric material with respect to a total volume of a body is relatively decreased.

In order to implement high capacitance within a multilayer ceramic capacitor having the same volume as a conventional multilayer ceramic capacitor, a thickness and a volume of the dielectric layers used as upper and lower covers should be decreased in accordance with an increase in the number of internal electrode layers formed by printing, but defects such as cracks, delamination, and the like, may occur at an interface between an active region which includes internal electrodes and a cover region which does not include internal electrodes.

SUMMARY

An aspect of the present disclosure provides a multilayer ceramic capacitor having decreased cracks and delamination occurring in an interface between an active region and a cover region, and a board having the same.

According to an aspect of the present disclosure, a multilayer ceramic capacitor includes: a body including an active region including first and second internal electrodes, and a cover region disposed on and below the active region; and first and second external electrodes disposed on first and second surfaces of the body in the length direction and connected to the first and second internal electrodes, respectively. At least one stress dispersion pattern is disposed in the cover region, and the stress dispersion pattern occupies an area equal to 30% to 95% of an area of the first or second internal electrode.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
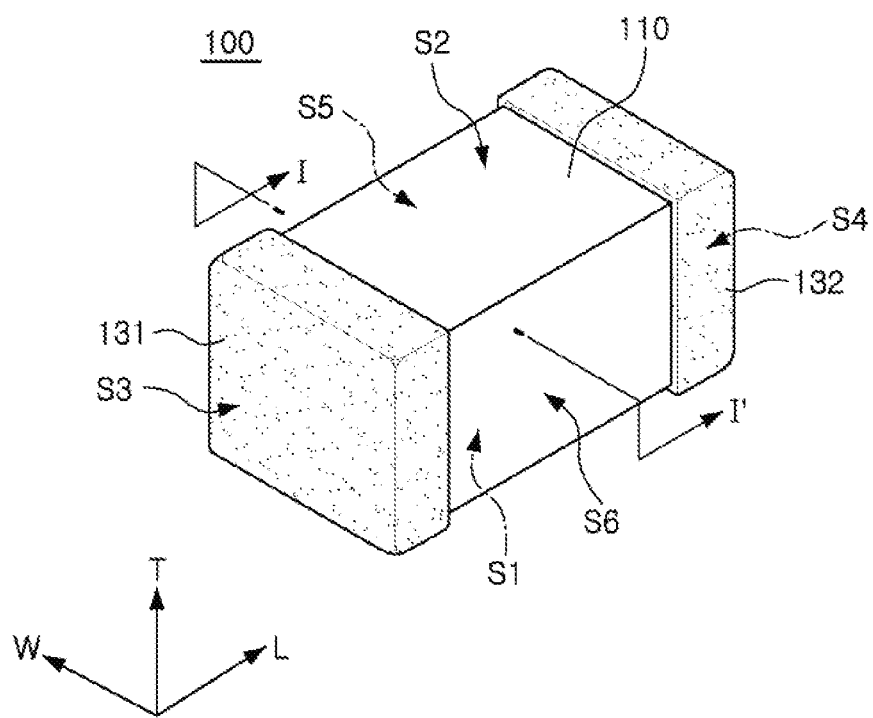
FIG. 1 is a perspective view schematically illustrating a multilayer ceramic capacitor according to an exemplary embodiment in the present disclosure.
Figure 2A:
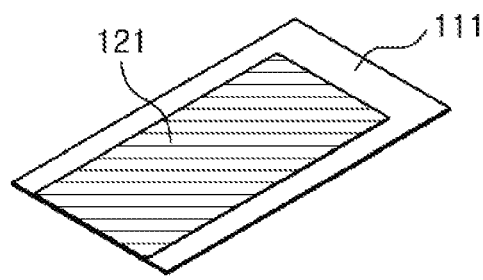
FIGS. 2A through 2D are exploded perspective views illustrating a stacking structure of first and second internal electrodes and stress dispersion patterns in the multilayer ceramic capacitor shown in FIG. 1.
Figure 2B:
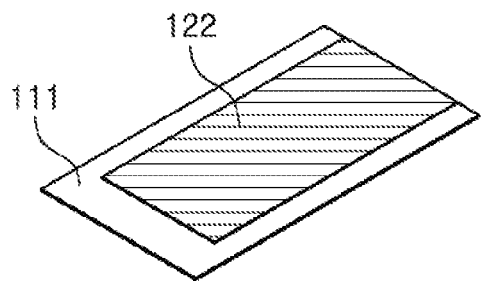
Figure 2C:
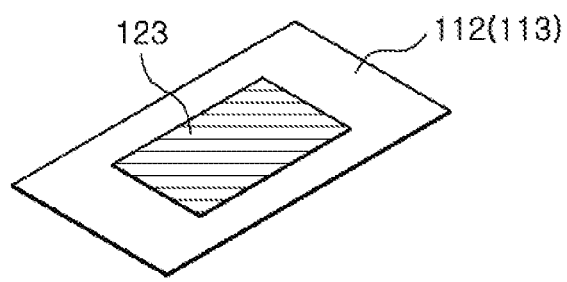
Figure 2D:
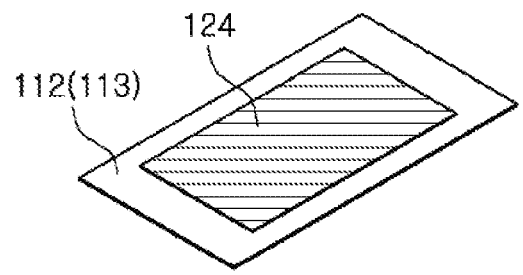

Hereinafter, exemplary embodiments of the present disclosure will now be described in detail with reference to the accompanying drawings.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Directions of a hexahedron will be defined in order to clearly describe exemplary embodiments in the present disclosure. L, W and T shown in the accompanying drawings refer to a length direction, a width direction, and a thickness direction, respectively.

Here, the thickness direction may be the same as a stacking direction in which dielectric layers are stacked.

Multilayer Ceramic Capacitor

Figure 3:
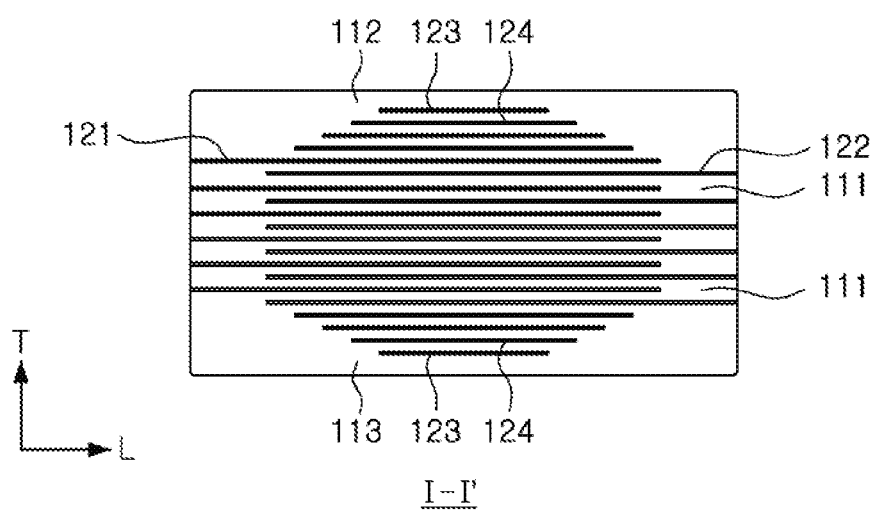
FIG. 3 is a cross-sectional view taken along line I-I' of FIG. 1.

FIG. 1 is a perspective view schematically illustrating a multilayer ceramic capacitor according to an exemplary embodiment in the present disclosure, FIGS. 2A through 2D are exploded perspective views illustrating a stacking structure of first and second internal electrodes and a stress dispersion pattern of FIG. 1, and FIG. 3 is a cross-sectional view taken along line I-I' of FIG. 1.

Referring to FIGS. 1 through 3, a multilayer ceramic capacitor 100 according to the present exemplary embodiment may include a body 110, first and second external electrodes 131 and 132, and a stress dispersion pattern.

The body 110 may include an active region including a plurality of dielectric layers 111 stacked in the thickness direction and a plurality of first and second internal electrodes 121 and 122 alternately stacked in the thickness direction with at least one among the plurality of dielectric layers 111 interposed therebetween, an upper cover region disposed on the active region, and a lower cover region disposed below the active region.

The body 110 may be formed by stacking the plurality of dielectric layers 111 and first and second internal electrodes 121 and 122 in the thickness direction and sintering the stacked dielectric layers and internal electrodes, and a shape of the body 110 is not particularly limited, but may have a substantially hexahedral shape as illustrated.

In the present exemplary embodiment, the body 110 may have, for example, dimensions (length×width×thickness) of 0.4×0.2×0.2 to 4×2×2 (mm).

In this case, the body 110 may have first and second surfaces S1 and S2 opposing each other in the thickness (T) direction, third and fourth surfaces S3 and S4 connecting the first and second surfaces S1 and S2 to each other and opposing each other in the length (L) direction, and fifth and sixth surfaces S5 and S6 opposing each other in the width (W) direction.

Hereinafter, in the present exemplary embodiment, a description will be provided on the assumption that a mounted surface of the multilayer ceramic capacitor 100 is the first surface S1 of the body 110.

The dielectric layers 111 may be in a sintered state, and adjacent dielectric layers 111 may be integrated with each other so that boundaries therebetween are not readily apparent without a scanning electron microscope (SEM).

In this case, a thickness of the dielectric layer 111 may be optionally changed according to the capacitance design of the multilayer ceramic capacitor 100, but a thickness of a single dielectric layer may preferably be 0.01 to 1.00 μm after sintering. However, the thickness of the dielectric layer is not limited thereto.

Furthermore, the number of stacked dielectric layers may be, for example, 50 to 1,000.

The dielectric layer 111 may contain a ceramic powder having high permittivity, for example, a barium titanate ($BaTiO_3$) based powder, a strontium titanate ($SrTiO_3$) based powder, magnesium titanate, or the like, but the material of the dielectric layer 111 is not limited thereto as long as sufficient capacitance may be obtained.

In addition, at least one of a ceramic additive, an organic solvent, a plasticizer, a binder, a dispersant, and the like, may be further added to the dielectric layer 111 together with the ceramic powder.

The cover region may be composed of covers 112 and 113 disposed at both outermost portions of the body 110 in the thickness direction, respectively, as margins of the body 110 in the thickness direction.

The covers 112 and 113 may have the same material and configuration as those of the dielectric layer 111 except that internal electrodes are not included therein.

The covers 112 and 113 may be formed by stacking one or two or more dielectric layers on both outermost portions of the body 110 in the thickness direction, respectively, and may generally serve to prevent the first and second internal electrodes 121 and 122 from being damaged by physical or chemical stress.

In this case, the number of stress dispersion patterns 123 and 124 formed in the cover region may be one or more. The stress dispersion patterns 123 and 124 may disperse stress of the body 110 at the time of sintering, thereby serving to prevent cracks and delamination from occurring.

When the stress dispersion patterns 123 and 124 are formed as described above, stress due to differences in heat treatment shrinkage rate of the cover region and shrinkage deformation of the active region depending on a temperature may not be concentrated in a boundary surface between the cover region and the active region at once, but may be transferred in portions to several layers in the boundary surface, such that stress may be dispersed.

The stress dispersion patterns 123 and 124 as described above may occupy 30% to 95% of an area or volume of the first or second internal electrode 121 or 122.

In this case, when the area or volume of the stress dispersion patterns 123 and 124 is less than 30% or more than 95% of the area or the volume of the first or second internal electrode 121 or 122, a stress dispersion effect may be deteriorated, such that delamination may occur in the body 110.

Further, the stress dispersion patterns 123 and 124 may not be connected to the external electrodes and may be floating electrodes positioned within the body 110.

In this case, at least two layers composed of the stress dispersion patterns 123 and 124 may be stacked in the upper or lower cover 112 or 113 and may have a structure in which the area of the stress dispersion patterns 123 and 124 is increased from an upper or lower end of the body 110 to a central portion of the body 110.

As another example, at least two layers composed of the stress dispersion patterns 123 and 124 may be stacked in an upper or lower cover 112 or 113, and only one of lengths or widths of the stress dispersion patterns 123 and 124 are increased in the upper or lower end of the body 110.

The stress dispersion patterns 123 and 124 may form a tapered shape in the stacking direction due to the above-mentioned structure.

Therefore, when the stress dispersion patterns 123 and 124 are formed so that the area thereof is gradually decreased outwardly in an interface between the active region and the upper or lower cover 112 or 113, the difference in shrinkage rate may be gradually decreased due to the stress dispersion patterns 123 and 124, such that the stress in the interface between the active region and the cover region may be further decreased, and an interlayer delamination prevention effect may be further improved.

The numbers and shapes of stress dispersion patterns 123 and 124 stacked in the upper cover region may be the same as those of the stress dispersion patterns 123 and 124 stacked in the lower cover region.

Therefore, the multilayer ceramic capacitor 100 may have a vertically symmetrical structure, such that at the time of mounting the multilayer ceramic capacitor 100, vertical directionality of the multilayer ceramic capacitor may be removed.

The first and second external electrodes 131 and 132 may be disposed on the third and fourth surfaces S3 and S4 of the body 110 and contact exposed end portions of the first and second internal electrodes 121 and 122 to thereby be electrically connected thereto, respectively.

Further, the first and second external electrodes 131 and 132 may include conductive layers formed on the third and fourth surfaces S3 and S4 of the body 110 and plating layers formed on the conductive layers, respectively.

The plating layers may include nickel (Ni) plating layers and tin (Sn) plating layers formed on the nickel (Ni) plating layers.

The first and second external electrodes 131 and 132 may include connection portions formed on the third and fourth surfaces S3 and S4 of the body 110 and first and second band portions extended from the connection portions to portions of the fifth and sixth surfaces S5 and S5 of the body 110 and a portion of the first or second surface S1 or S2 of the body 110, respectively.

Therefore, adhesion strength of the first and second external electrodes 131 and 132 may be improved.

The first and second internal electrodes 121 and 122, which are electrodes applied with different polarities, may be alternately disposed in the body 110 in the thickness direction with at least one of the dielectric layers 111 interposed therebetween.

In this case, the first and second internal electrodes 121 and 122 may be electrically insulated from each other by the dielectric layer 111 disposed therebetween.

A thickness of the first and second internal electrodes 121 and 122 may be determined according to the use thereof. For example, the thickness of the first and second internal electrodes 121 and 122 may be determined in a range of 0.2 to 1.0 µm in consideration of a size of the body 110, but is not limited thereto.

The number of stacked first and second internal electrodes 121 and 122 may be, for example, 50 to 1,000.

In addition, a material forming the first and second internal electrodes 121 and 122 is not particularly limited. For example, the first and second internal electrodes 121 and 122 may be formed using a conductive paste formed of at least one among a noble metal material such as palladium (Pd), a palladium-silver (Pd—Ag) alloy, or the like, nickel (Ni), and copper (Cu).

Here, as a printing method of the conductive paste, a screen printing method, a gravure printing method, or the like, may be used, but the present disclosure is not limited thereto.

Modified Exemplary Embodiment

Figure 4A:
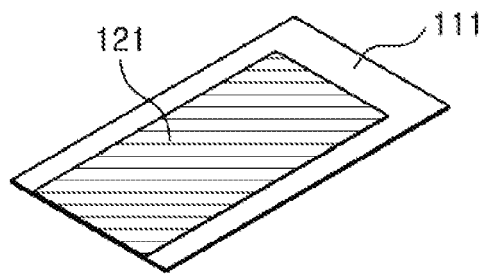
FIGS. 4A through 4D are perspective views illustrating the first and second internal electrodes and the stress dispersion patterns according to another exemplary embodiment.
Figure 4B:
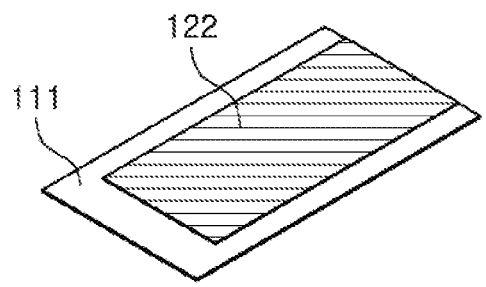
Figure 4C:
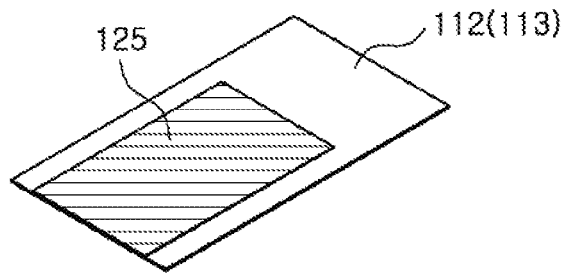
Figure 4D:
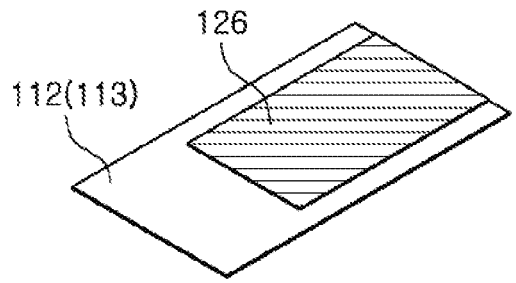
Figure 5:
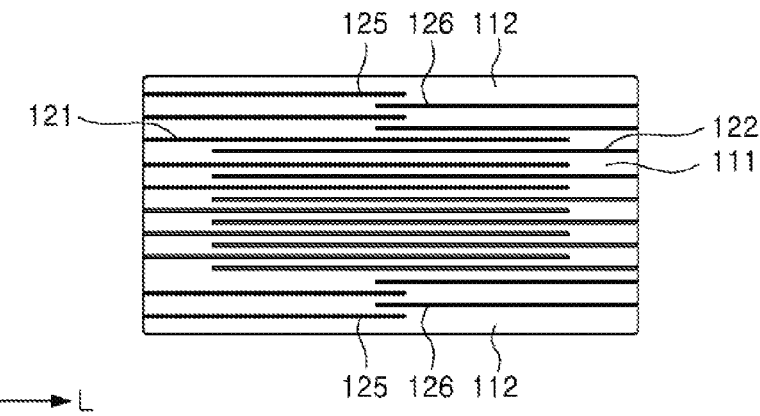
FIG. 5 is an exploded perspective view illustrating a stacking structure of first and second internal electrodes and the stress dispersion patterns of FIGS. 4A through 4D.

FIGS. 4A through 4D are perspective views illustrating other examples of the stress dispersion patterns of FIG. 1, and FIG. 5 is a exploded perspective view illustrating a stacking structure of first and second internal electrodes and the stress dispersion patterns of FIGS. 4A through 4D.

Here, a detailed description of the same portions as those in the exemplary embodiment described above will be omitted in order to avoid an overlapped description, and a stress dispersion pattern having a different structure from that described above in the exemplary embodiment will be described in detail.

Referring to FIGS. 4A through 5, the stress dispersion pattern according to the present exemplary embodiment may include first and second stress dispersion patterns 125 and 126, wherein the first and second stress dispersion patterns 125 and 126 may be alternately disposed in the stacking direction of the body 110.

In addition, the first and second stress dispersion patterns 125 and 126 may contact the first and second external electrodes 131 and 132 to thereby be electrically connected thereto, respectively. When the first and second stress dispersion patterns 125 and 126 contact the first and second external electrodes 131 and 132, respectively, a decrease in capacitance may be decreased.

In this case, a length of each of the first and second stress dispersion patterns 125 and 126 may be equal to or greater than a half of a length of the body 110.

Therefore, the first and second stress dispersion patterns 125 and 126 may have a structure in which end portions thereof partially overlap each other.

In this case, an overlapping portion between the first and second stress dispersion patterns 125 and 126 may preferably occupy an area equal to 10% to 70% of the length of the body 110.

Further, the numbers of first and second stress dispersion patterns 125 and 126 stacked in the upper cover region may be the same as that of the first and second stress dispersion patterns 125 and 126 stacked in the lower cover region, such that the multilayer ceramic capacitor may have a vertically symmetrical structure.

Board Having Multilayer Ceramic Capacitor

Figure 6:
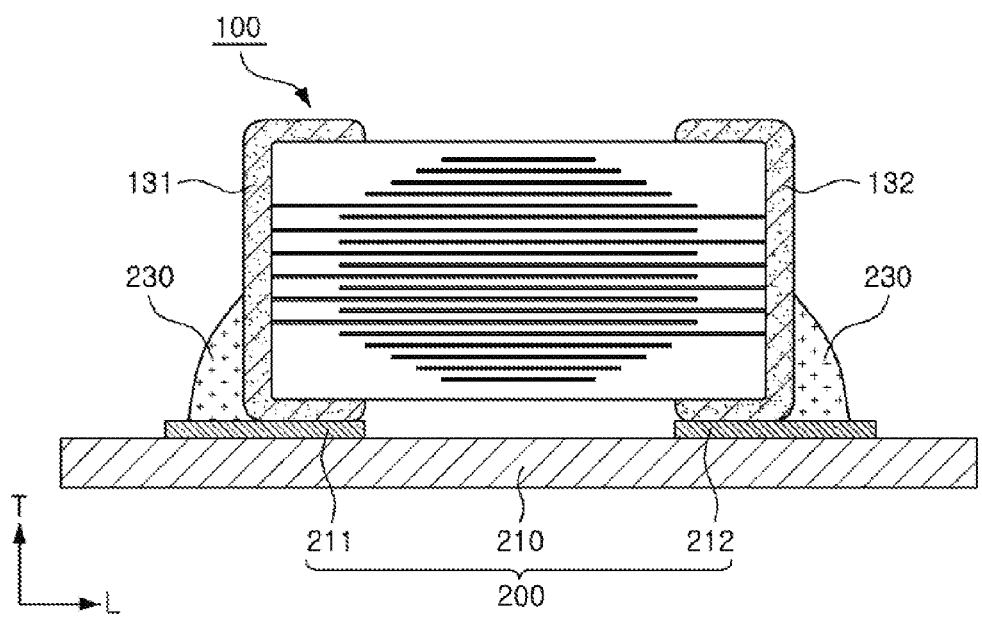
FIG. 6 is a cross-sectional view illustrating a board in which the multilayer ceramic capacitor of FIG. 1 is mounted on a circuit board.

FIG. 6 is a cross-sectional view illustrating a board in which the multilayer ceramic capacitor of FIG. 1 is mounted on a circuit board.

Referring to FIG. 6, a board 200 having a multilayer ceramic capacitor according to the present exemplary embodiment may include a circuit board 210 on which the multilayer ceramic capacitor 100 is mounted and first and second electrode pads 221 and 222 formed on the circuit board 210 to be spaced apart from each other.

The multilayer ceramic capacitor 100 may be electrically connected to the circuit board 210 by a solder 230 in a state in which the first and second external electrodes 131 and 132 are positioned to contact the first and second electrode pads 221 and 222, respectively.

Although the board in which the multilayer ceramic capacitor of FIG. 1 is mounted on the circuit board 210 is illustrated and described in the present exemplary embodiment, the board is not limited thereto.

Figure 7:
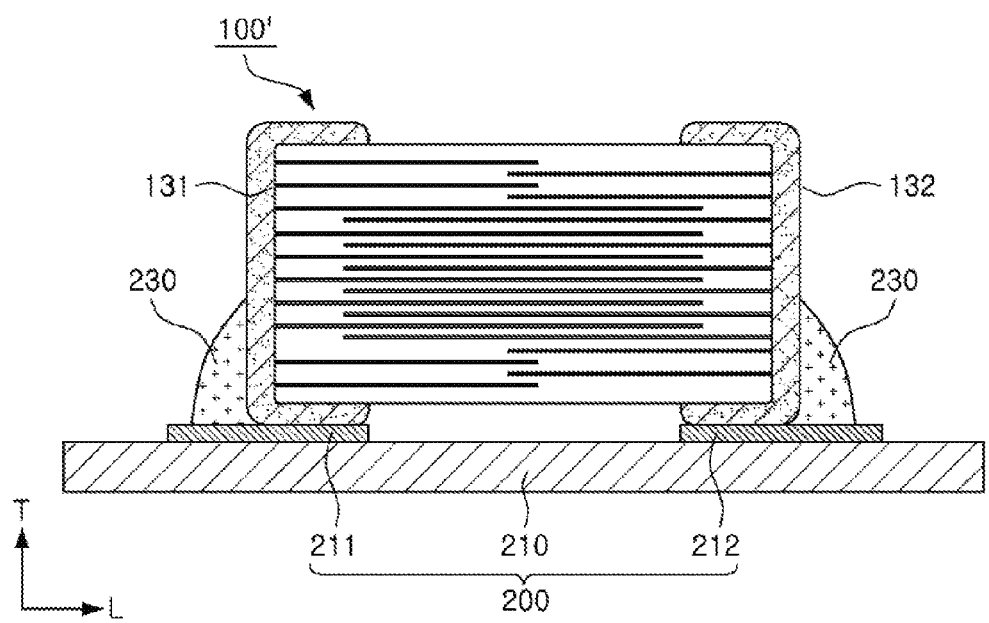
FIG. 7 is a cross-sectional view illustrating a board in which the multilayer ceramic capacitor of FIG. 5 is mounted on a circuit board.

As an example, a board having a multilayer ceramic capacitor may be configured by mounting the multilayer ceramic capacitor 100' illustrated in FIG. 5, or the like, on a circuit board in a similar structure as illustrated in FIG. 7.

As set forth above, according to exemplary embodiment in the present disclosure, cracks and delamination occurring in the interface between the active region and the cover region may be decreased by disposing the stress dispersion pattern occupying 30% to 95% of the area of the internal electrode in the cover region.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
   a body including an active region including a plurality of dielectric layers and first and second internal electrodes alternately disposed with at least one among the plurality of dielectric layers interposed therebetween to be alternately exposed to first and second surfaces of the body in a length direction, respectively, an upper cover region disposed on the active region, and a lower cover region disposed below the active region; and
   first and second external electrodes disposed on the first and second surfaces of the body in the length direction and connected to the first and second internal electrodes, respectively, wherein
   at least one stress dispersion pattern is disposed in at least one of the upper and lower cover regions, the stress dispersion pattern occupying an area within a range of 30% to 95% of an area of the first or second internal electrode,
   the at least one stress dispersion pattern includes first and second stress dispersion patterns alternately disposed in a stacking direction in the at least one of the upper and lower cover regions, and connected to the first and second external electrodes, respectively, and
   a length or width of the first and second stress dispersion patterns is increased from an outer portion of the body to a central portion of the body.

2. The multilayer ceramic capacitor of claim 1, wherein an area of the first and second stress dispersion patterns is increased from the outer portion of the body to the central portion of the body.

3. The multilayer ceramic capacitor of claim 1, wherein a number of stress dispersion patterns stacked in the upper cover region is the same as a number of stress dispersion patterns stacked in the lower cover region, and the multilayer ceramic capacitor has a vertically symmetrical shape.

4. The multilayer ceramic capacitor of claim 1, wherein end portions of the first and second stress dispersion patterns overlap each other in the stacking direction.

5. The multilayer ceramic capacitor of claim 1, wherein lengths of the first and second stress dispersion patterns are equal to or longer than a half of a length of the body.

6. A board having a multilayer ceramic capacitor, the board comprising:
   a circuit board on which first and second electrode pads are formed; and
   the multilayer ceramic capacitor of claim 1, mounted on the circuit board so that the first and second external electrodes are disposed on the first and second electrode pads, respectively.

7. A multilayer ceramic capacitor comprising:
   a body including an active region including a plurality of dielectric layers and first and second internal electrodes alternately disposed with at least one among the plurality of dielectric layers interposed therebetween to be alternately exposed to first and second surfaces of the body in a length direction, respectively, an upper cover region disposed on the active region, and a lower cover region disposed below the active region; and
   first and second external electrodes disposed on the first and second surfaces of the body in the length direction and connected to the first and second internal electrodes, respectively, wherein
   at least one stress dispersion pattern is disposed in at least one of the upper and lower cover regions, the stress dispersion pattern occupying an area within a range of 30% to 95% of an area of the first or second internal electrode,
   the at least one stress dispersion pattern includes first and second stress dispersion patterns alternately disposed in a stacking direction in the at least one of the upper and lower cover regions, and connected to the first and second external electrodes, respectively, and
   an area of the first and second stress dispersion patterns is increased from an outer portion of the body to a central portion of the body.

* * * * *